United States Patent [19]
Lim

[11] Patent Number: 5,825,173
[45] Date of Patent: Oct. 20, 1998

[54] CIRCUIT FOR DETECTING PHASE ANGLE OF THREE-PHASE ALTERNATING CURRENT

[75] Inventor: Chung-hyuck Lim, Seoul, Rep. of Korea

[73] Assignee: Samsung Electronics Co., Ltd., Kyungki-do, Rep. of Korea

[21] Appl. No.: 888,638

[22] Filed: Jul. 7, 1997

[30] Foreign Application Priority Data

Aug. 19, 1996 [KR] Rep. of Korea ............... 1996-34293

[51] Int. Cl.⁶ .................................................. G01R 25/00
[52] U.S. Cl. .................................. 324/76.77; 324/76.79; 324/86; 327/3; 327/5
[58] Field of Search ............................ 324/76.53, 76.79, 324/76.78, 76.77, 86; 327/3, 5, 7, 147, 233, 363, 551

[56] References Cited

U.S. PATENT DOCUMENTS

| | | | |
|---|---|---|---|
| 3,971,996 | 7/1976 | Motlet et al. | 327/233 |
| 4,068,210 | 1/1978 | Corkhill | 324/76.79 |
| 4,355,284 | 10/1982 | Acker | 327/233 |
| 4,636,720 | 1/1987 | Farr | 324/76.77 |
| 4,700,129 | 10/1987 | Yoshizawa et al. | 324/76.77 |
| 5,299,232 | 3/1994 | Larosa et al. | 327/233 |

*Primary Examiner*—Diep N. Do
*Attorney, Agent, or Firm*—Burns, Doane, Swecker & Mathis LLP

[57] ABSTRACT

A circuit for detecting the phase angle of a three-phase alternating current includes a plurality of low-pass filters installed at each input port for removing noise and high-frequency signals mixed in an alternating current input signal, a plurality of multipliers each for multiplying the signal output from each of the low-pass filter by a feedback signal, a subtracter for receiving the signals output from the plurality of multipliers and calculating an error between two signals, a loop filter for receiving the signal output from the subtracter and filtering the same, an integrator for receiving the signal output from the loop filter, time-integrating the same, and outputting an estimated digital phase angle signal, and a phase delay compensator installed between the subtracter and the loop filter, for compensating for phase delay of the input signal caused by the low-pass filters. Although the phase of the input signal is delayed by the low-pass filters for removing noise and high frequency signals installed at each input port, the delayed phase is automatically compensated for by the phase delay compensator. Thus, an estimating system can accurately estimate the phase angle.

3 Claims, 1 Drawing Sheet

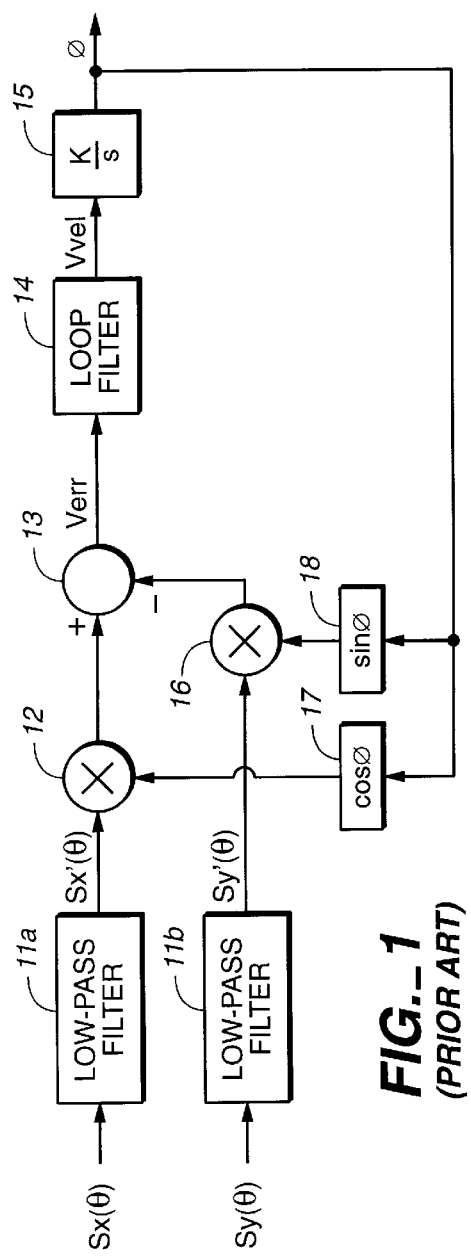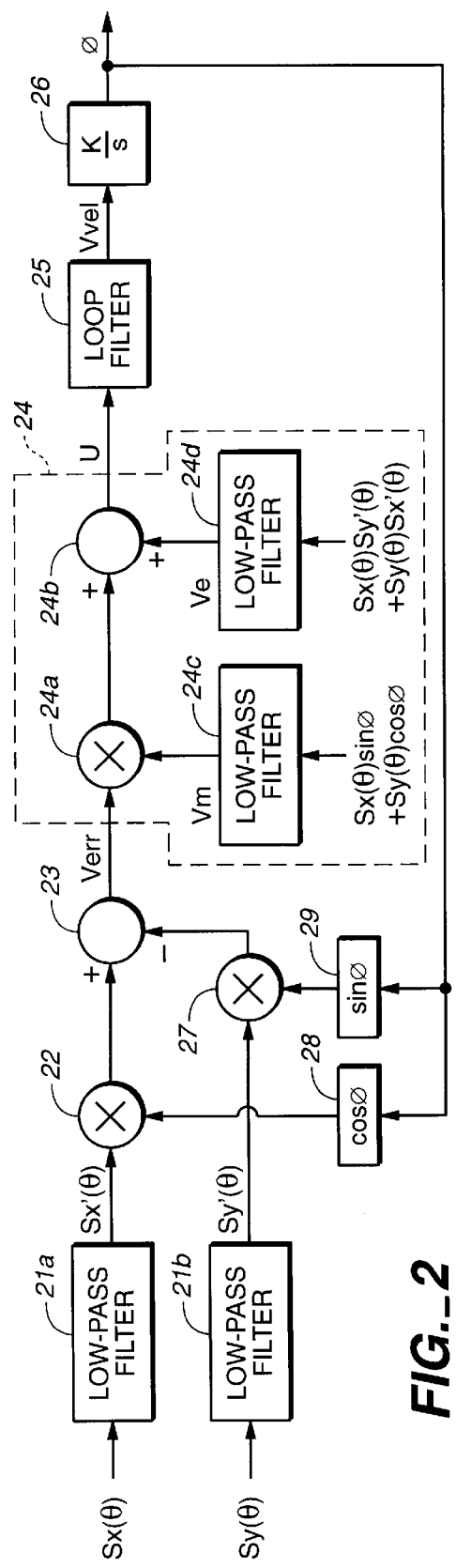

CIRCUIT FOR DETECTING PHASE ANGLE OF THREE-PHASE ALTERNATING CURRENT

BACKGROUND OF THE INVENTION

The present invention relates to a circuit for detecting the phase angle of a three-phase alternating current (AC), and more particularly, to a circuit for detecting the phase angle of a three-phase AC by which phase delay of an input signal can be automatically compensated for.

Typically, a three-phase AC is composed of three currents each having the same frequency and a different phase. The three-phase AC is classified into a symmetrical three-phase AC and a nonsymmetrical three-phase AC. Here, the symmetrical three-phase AC will be expressed by the following Equation 1.

$$\begin{cases} a(\theta) = A\sin\theta \\ b(\theta) = A\sin\left(\theta - \frac{2}{3}\pi\right) \\ c(\theta) = A\sin\left(\theta - \frac{4}{3}\pi\right) \end{cases} \quad (1)$$

Here, $a(\theta)$, $b(\theta)$ and $c(\theta)$ represent three-phase sinusoidal wave functions and A denotes the amplitude of a sinusoidal wave. Also, Equation 1 is equivalently transformed and represented as a two-phase sinusoidal wave signal as the following Equation 2.

$$\begin{cases} Sx(\theta) = A'\sin\theta \\ Sy(\theta) = A'\cos\theta \end{cases} \quad (2)$$

In the prior art, the three-phase AC is detected using Equation 2. That is, when the upper equation of Equation 2 is divided by the lower equation thereof, the following Equation 3 is obtained.

$$\frac{Sx(\theta)}{Sy(\theta)} = \frac{\sin\theta}{\cos\theta} = \tan\theta \quad (3)$$

Also, the following Equation 4 is derived from Equation 3.

$$\theta = \tan^{-1}\left(\frac{\sin\theta}{\cos\theta}\right) \quad (4)$$

Accordingly, the phase angle $\theta$ of the three-phase AC can be obtained from Equation 4.

However, according to the conventional method, the calculation or operation is easily understood, but it is almost impossible that $\theta$ is estimated around 90° and 270° where the value of $\cos\theta$ is converged on "0".

On the other hand, the conventional method had ever used another method of obtaining the phase angle of the three-phase AC by constituting an estimating system using a phase locked loop (PLL) as shown in FIG. 1 with reference to Equation 2. Referring to FIG. 1, reference numerals 11a and 11b denotes low-pass filters each for removing noise and high-frequency signals which are mixed in an input AC signal, reference numerals 12 and 16 are multipliers, reference numeral 13 is a subtracter, reference numeral 14 is a loop filter, reference numeral 15 is an integrator, reference numeral 17 is a cosine function generator, reference numeral 18 is a sine function generator, reference characters Sx' ($\theta$) and Sy' ($\theta$) are two-phase sinusoidal signals whose each phase is delayed, reference character Verr is a phase estimation error of the estimating system, reference character Vvel is a phase speed signal, and reference symbol $\phi$ indicates an estimated digital phase angle.

Of other methods of estimating the phase angle $\theta$, the scheme of FIG. 1 provides the most rapid response. However, the low-pass filters 11a and 11b installed at each input port cause phase delay of each input signal as can be seen from the following Equation 5.

$$Sx'(\theta) = A\sin\{\theta - \alpha(\dot\theta)\} \quad (5)$$

$$Sy'(\theta) = A\cos\{\theta - \alpha(\dot\theta)\}$$

Therefore, even though the estimating system operates well, it estimates not the $\theta$ but the $\theta - \alpha(\dot\theta)$. Here, the $\alpha(\dot\theta)$ denotes the value of the delayed phase.

SUMMARY OF THE INVENTION

It is an object of the present invention to provide a circuit for detecting the phase angle of a three-phase alternating current (AC) by which phase delay caused by input filters can be automatically compensated for.

To accomplish the above object, there is provided a circuit for detecting the phase angle of a three-phase alternating current, including a plurality of low-pass filters installed at each input port for removing noise and high-frequency signals mixed in an alternating current input signal, a plurality of multipliers each for multiplying the signal output from each of the low-pass filter by a feedback signal, a subtracter for receiving the signals output from the plurality of multipliers and calculating an error between two signals, a loop filter for receiving the signal output from the subtracter and filtering the same, an integrator for receiving the signal output from the loop filter, time-integrating the same, and outputting an estimated digital phase angle signal, and a phase delay compensator installed between the subtracter and the loop filter, for compensating for phase delay of the input signal caused by the low-pass filters.

According to the present invention, although the phase of the input signal is delayed by the low-pass filters installed at each input port, for removing noise and high frequency signals, the phase delay compensator compensates for the delayed phase automatically. Therefore, an estimating system can estimate an exact phase angle.

BRIEF DESCRIPTION OF THE DRAWINGS

The above object and advantages of the present invention will become more apparent by describing in detail a preferred embodiment thereof with reference to the attached drawings in which:

FIG. 1 is a block diagram showing the structure of a conventional circuit for detecting the phase angle of a three-phase alternating current (AC); and FIG. 2 is a block diagram showing the structure of a circuit for detecting the phase angle of a three-phase alternating current (AC) according to the present invention.

DETAILED DESCRIPTION OF THE INVENTION

Referring to FIG. 2, in a circuit for detecting the phase angle of a three-phase alternating current (AC) according to the present invention, two low-pass filters 21a and 21b for removing noise and high-frequency signals mixed in equivalently-transformed two-phase sinusoidal input signals Sx($\theta$) and Sy($\theta$) are installed at each input port. First and second multipliers 22 and 27 for multiplying signals output from the two low-pass filters 21a and 21b (i.e., phase-delayed two-phase sinusoidal signals Sx' ($\theta$) and Sy' ($\theta$)) by feedback signals are installed at the rear sides of the low-pass filters 21a and 21b, respectively. A subtracter 23 for receiving the output signals of the first and second multipliers 22 and 27 and obtaining an error between the input signals is also installed at the rear sides of the low-pass filters 21a and 21b.

Also, a phase delay compensator 24 for compensating for the phase delay of the input signals Sx(θ) and Sy(θ) which is caused by the low-pass filters 21a and 21b is installed at the rear side of the subtracter 23. A loop filter 25 for receiving and filtering the output signal of the phase delay compensator 24 and an integrator 26 for receiving and time-integrating the output signal of the loop filter 25 and outputting an estimated digital phase angle (φ) signal are also sequentially installed at the rear side of the subtracter 23. Also, cosine and sine function generators 28 and 29 for receiving the estimated digital phase angle (φ) and generating a cosine function and a sine function with respect to the feedback phase angle (φ), respectively, are provided in the circuit for detecting the phase angle of a three-phase AC according to the present invention.

Here, the phase delay compensator 24 includes a multiplier 24a for multiplying the output signal of the subtracter 23 by a first compensating signal Vm, an adder 24b for adding the output signal of the multiplier 24a to a second compensating signal Ve, and two low-pass filters 24c and 24d for supplying the first and second compensating signals Vm and Ve to the multiplier 24a and the adder 24b, respectively. Sx(θ)sin φ+Sy(θ)cos φ as an input signal is input to the low-pass filter 24c for supplying the input signal to the multiplier 24a. Sx(θ)Sy' (θ)−Sy(θ)Sx' (θ) as an input signal is input to the low-pass filter 24d for supplying the input signal to the adder 24b.

As for the circuit for detecting the phase angle of a three-phase alternating current (AC) according to the present invention having such a configuration, Sx(θ)sin φ+Sy(θ)cos φ and Sx(θ)Sy' (θ)−Sy(θ)Sx' (θ) are input to the low-pass filters 24c and 24d within the phase delay compensator 24, respectively, as described above. Here, these signals have a relatively low frequency compared to the input signals Sx(θ) and Sy(θ).

Also, the signals output from the low-pass filters 24c and 24d are summarized according to the following Equations 6 and 7.

$$Vm = A \cos(\theta - \phi) \tag{6}$$

Here, Equation 6 is obtained under the supposition that $$Ve = A^2 \sin \alpha(\dot{\theta}) \tag{7}$$

changes of θ−φ and α(θ̇) are not drastic.

The output signal Ve' of the multiplier 24a in the phase delay compensator 24 can be expressed by the following Equation 8.

$$Ve' = V^2 \cos(\theta - \phi) \sin\{(\theta - \phi) - \alpha(\dot{\theta})\} \tag{8}$$

Accordingly, the input signal (u) of the loop filter 25 is expressed by the following Equation 9.

$$u = Ve' + Ve = V^2 \cos\{e - \alpha(\dot{\theta})\} \sin e \tag{9}$$

Here, e equals the value of θ−φ.

Meanwhile, if the value of e−α(θ̇) is sufficiently small and the amount of change thereof is not drastic, the value of u can approximate to the following formula 10.

$$u \approx V^2 \sin e \tag{10}$$

As will be understood from the above formula, a signal-to-noise ratio (S/N) increases while the operational form, i.e., a basic principle of the operation of the phase angle detecting circuit is the same as that of the prior art, so that the phase angle detecting circuit may be actually further strong against noise. Now, a fundamental process, i.e., an assumption part, for obtaining the Equation 9 will be described in detail. If the phase angle detecting circuit overcomes an initial error and performs tracking, the e in e−α(θ̇) is typically several bits or below and the phase delay of the input filter does not be sharply changed in view of its characteristics of the filter and the filter can also be designed to be sufficiently small, so that the value of e−α(θ̇) may be sufficiently small.

As described above, in the circuit for detecting the phase angle of a three-phase AC according to the present invention, although the phase of the input signal is delayed by the low-pass filters for removing noise and high frequency signals which are installed at each input port, the delayed phase is automatically compensated for by the phase delay compensator. Thus, the estimating system can accurately estimate the phase angle.

What is claimed is:

1. A circuit for generating a detection output indicative of the phase angle of a three-phase alternating current provided as an alternating current input signal at two input ports of the circuit, the circuit comprising:

a low pass filter installed at each input port for removing noise and high-frequency signals mixed in the alternating current input signal;

multiplier operably connected to each low pass filter for multiplying the signal output from each low-pass filter by a feedback signal derived from the detection output;

a subtracter for receiving the signals output from said multipliers and calculating an error between the signals output from said multipliers;

a loop filter for receiving and filtering the signal output from said subtracter;

an integrator for receiving and time-integrating the output from said loop filter to thereby output an estimated digital phase angle signal; and a phase delay compensator installed between said subtracter and said loop filter, for compensating for phase delay of the input signal caused by said low-pass filter at each input port.

2. A circuit for generating a detection output indicative of the phase angle of a three-phase alternating current provided as an alternating current input signal at two input ports of the circuit, the circuit comprising:

a low pass filter installed at each input port for removing noise and high-frequency signals mixed in the alternating current input signal;

a multiplier operably connected to each low pass filter for multiplying the signal output from each low-pass filter by a feedback signal derived from the detection output, a subtracter for receiving the signals output from said multipliers and calculating an error between the signals output from said multipliers;

a loop filter for receiving and filtering the signal output from said subtracter;

an integrator for receiving and time-integrating the output from said loop filter to thereby output an estimated digital phase angle signal; and a phase delay compensator installed between said subtracter and said loop filter, for compensating for phase delay of the input signal caused by said low-pass filter at each input port, wherein said phase delay compensator is comprised of a multiplier for multiplying the output of said subtracter by a first compensating signal, an adder for the output of said multiplier to a second compensating signal, and two low-pass filters for supplying said first and second compensating signals to said multiplier and said adder, respectively.

3. A circuit for detecting the phase angle of a three-phase alternating current as claimed in claim 2, wherein $Sx(\theta) \sin \phi + Sy(\theta) \cos \phi$ as an input signal is input to one of said phase delay compensator low-pass filters for supplying said first compensating signal to said phase delay compensator multiplier and $Sx(\theta)Sy'(\theta) - Sy(\theta)Sx'(\theta)$ as an input signal is input to low-pass filters for supplying said second compensating signal to said phase delay compensator adder, in which $Sx(\theta)$ and $Sy(\theta)$ are equivalently-transformed two-phase sinusoidal signal of a three-phase alternating current having a phase angle of $\theta$, $Sx'(\theta)$ and $Sy'(\theta)$ are phase-delayed two-phase sinusoidal signal, and $\phi$ is an estimated digital phase angle.

* * * * *